Feb. 4, 1958 HUNG C. LIN 2,822,430

TRANSISTOR AMPLIFIER CIRCUIT

Filed Aug. 15, 1956

INVENTOR.
HUNG C. LIN
BY
H. L. Newton
ATTORNEY

United States Patent Office 2,822,430

Patented Feb. 4, 1958

2,822,430

TRANSISTOR AMPLIFIER CIRCUIT

Hung C. Lin, Levittown, Pa., assignor to Radio Corporation of America, a corporation of Delaware Application August 15, 1956, Serial No. 604,276

6 Claims. (Cl. 179—100.4)

This invention relates to transistor amplifier circuits for electro-mechanical transducers having essentially capacitive internal impedance.

Electro-mechanical transducers, such as crystal phonograph pickups and the like, are usually operated into a high impedance load in order that the frequency response may remain substantially flat, that is, unvarying with respect to frequency down to the low audio or bass frequencies. When transistor amplifiers are used, however, the input impedance into which the transducer must work is generally low. In order to raise the input impedance of a transistor, for example, in a base input connection for a transistor amplifier, an additional impedance may be connected in series with either the base electrode of the transistor or in series with the emitter electrode. Unfortunately, the series impedance in the base electrode gives rise to a large amount of noise in the amplifier, and the series impedance in the emitter electrode requires a relatively high supply voltage due to the large voltage drop in the emitter resistor.

It is therefore an object of the invention to provide an improved transistor input amplifier stage for electro-mechanical transducers, or the like, that have an essentially capacitive internal impedance.

It is another object of the invention to provide an improved transistor amplifier circuit for piezoelectric crystal type phonograph or microphone transducers and the like having low noise operating characteristics and low supply voltage requirements.

In accordance with the invention, the input impedance for a transistor amplifier, to properly compensate for the low impedance of the transducer may be attained by connecting a resistor of relatively low resistance in the emitter electrode circuit of a common emitter transistor amplifier circuit to provide a reasonably high input impedance and by connecting a capacitor impedance element in parallel with the input circuit of the transistor amplifier.

The invention may be further understood when the following description is read in connection with the accompanying drawing, in which.

Figure 1:
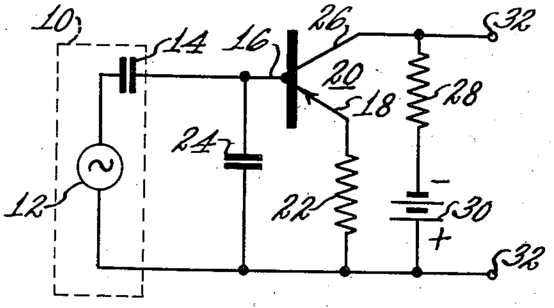
Figure 1 is a simplified schematic circuit diagram of a transistor amplifier circuit embodying the present invention.

Referring now to Figure 1, a phonograph or microphone electro-mechanical transducer element 10 (here indicated by a dotted rectangle) may be represented by its electrical equivalents of a voltage generator 12 in series with a capacitor 14. The transducer 10 is connected between the base electrode 16 and the emitter electrode 18 of a transistor 20 in series with an emitter resistor 22 to apply output signals developed by the transducer 10 to the input electrodes of the transistor 20.

An input capacitor 24, the function of which will be more fully explained hereinafter, is connected in parallel with the input circuit between the base electrode 16 and the end of the emitter resistor 22 remote from the emitter electrode 18. The collector electrode 26 of the transistor 20 is connected through a load resistor 28 to the negative terminal of a source of energizing current 30, here illustrated as a battery, which has its positive terminal connected to the end of the emitter resistor 22 remote from the emitter electrode 18. Output signals developed across the load resistor 28 may be derived from a pair of output terminals 32, one of which is connected to the collector electrode and the other of which is connected to the emitter electrode 18 through the emitter resistor 22. Bias supply connections for the base electrode 16, hereinafter described, are omitted from this figure in order to simplify the description.

If the input capacitor 24 were absent, in order that the low frequency signal current flowing out of the generator 12 will be substantially the same as the mid frequency current, the load impedance connected across the transducer 10 must be high in comparison to the source impedance, that is, the reactance of the internal capacitance 14. Expressed in another way, the resistance-capacitance time constant provided in the input circuit of the transistor amplifier should equal some high value. As an example, an ordinary crystal phonograph pickup for reproducing commercial phonograph recordings, which may have an internal capacitance on the order of 1,000 micro-microfarads, should have a load impedance on the order of one megohm to provide the proper time constant. This may conventionally be provided by a series resistance in the base electrode circuit. However, such a connection gives rise to an objectionally low signal-to-noise ratio and high distortion at low operating currents. A further expedient is to place a resistor in the emitter circuit so that a large impedance will be reflected into the input circuit and provide the proper time constant. This impedance is approximately equal to the value of the emitter resistor multiplied by the collector-to-base current gain of the transistor. However, the latter connection requires a large resistor in the emitter circuit and a considerable portion of the voltage of the supply circuit is wasted across this emitter resistor.

In accordance with the invention, the proper input impedance characteristics are provided by connecting a relatively small value resistor in the emitter circuit and by connecting a capacitive element, an input capacitor 24, across the input circuit to the transistor. It will now be seen that the equivalent capacitance of the transducer 10 looking back from the base electrode 16, is greater than the internal capacitor 14 of the transducer 10. The internal capacitor 14 of the transducer 10 and the input capacitor 24 are in parallel and may be thought of as a single capacitor having a value equal to the sum of the two capacitors. For proper impedance termination of the transducer 10, the time constant must remain the same with the input capacitor 24 connected as without the input capacitor 24 connected in the circuit. This may be readily accomplished by a lower value of emitter resistor 22 with the input capacitor 24 in the circuit, since the equivalent capacitance has been increased by the value of the input capacitor 24 and the resistance thus required in the emitter circuit is smaller than would be required without the input capacitor 24. Thus, for the same operating current the voltage drop across the emitter resistor 22 will be less than would be required across a larger resistance value if the input capacitor 24 were not used.

In order to show that the impedance termination for the transducer 10 is proper and that the output current of the transistor 20 is the same with and without the input capacitor 24, it must be shown that the input currents to the base 16 are substantially equal in both cases.

If the input capacitor 24 were not present in the circuit shown in Figure 1, and the emitter resistor 22 were made large enough to produce the required time constant between the capacitance 14 of the transducer 10 and the effective input impedance of the transistor, the input current would be approximately $$I_1=\frac{E_1}{R_1+\frac{1}{j\omega C_1}} \qquad (1)$$

where $E_1$ is the voltage of the generator 12, $R_1$ is the value of the input resistance, $C_1$ the value of the capacitor 14 of the transducer 10, and $I_1$ is the input current.

With the input capacitor 24 connected as shown in Figure 1, the circuit can be again solved for the input current by the use of Thevenin's theorem. The equivalent Thevenin voltage generator, $E_0$ is then $$E_0=\frac{C_1}{C_1+C_2}E_1 \qquad (2)$$

where $C_2$ is the value of the input capacitor 24. The equivalent Thevenin impedance is the reactance of the sum of the input capacitance 24 and the capacitance 14 of the transducer 10, or $$C_1+C_2=C_0 \qquad (3)$$

where $C_0$ is the equivalent Thevenin capacitance. Equation 2 may be then simplified by substituting the values of Equation 3 and $$E_0=\frac{C_1}{C_0}E \qquad (4)$$

The input current $I_2$ with the input capacitor 24 connected is then $$I_2=\frac{E_0}{R_2+\frac{1}{j\omega C_0}}=\frac{C_0E_0}{C_0R_2+\frac{1}{j\omega}} \qquad (5)$$

where $R_2$ is the value of the new input resistance required to give the proper time constant. Substituting the value of $C_0$ from Equation 3 and the value of $E_0$ from Equation 2 in Equation 5

$$I_2=\frac{\frac{(C_1+C_2)C_1E_1}{(C_1+C_2)}}{C_0R_2+\frac{1}{j\omega}}=\frac{C_1E_1}{C_0R_2+\frac{1}{j\omega}} \qquad (6)$$

From an inspection of Equations 1 and 6, it will be seen that if the two time constants in the equations are made equal the input currents $I_1$ and $I_2$ will be equal. Rewritten in equation form this is $$C_1R_1=C_0R_2=(C_1+C_2)R_2 \qquad (7)$$

It will also be seen that the emitter resistance 22, with the input capacitor 24 connected, will be much smaller than without the capacitor 24. By rearranging Equation 7, it will be seen that the ratio of input resistance values required is $$R_2=\frac{C_1}{C_1+C_2}R_1 \qquad (8)$$

Since the input resistance of the amplifier circuit is approximately equal to the collector-to-base current gain multiplied times the emitter resistor 22, the required value of the emitter resistor 22 to give the proper value of input resistance $R_2$, as shown in Equation 8, is much smaller than that required to give an input resistance of $R_1$.

It will be seen from the above discussion that, in accordance with the invention, the resistance in circuit with the emitter electrode 18 may be drastically reduced by the use of the input capacitor 24.

The resistor 22 connected in circuit with the emitter electrode 18 will produce a slight amount of degeneration and it may be necessary in order to reproduce properly commercial phonograph records to reduce the degeneration of the circuit at high audio or treble frequencies, because commercial phonograph records may have reduced amplitude response at high audio frequency signals. One manner in which this may be done is shown in Figure 2.

Figure 2:
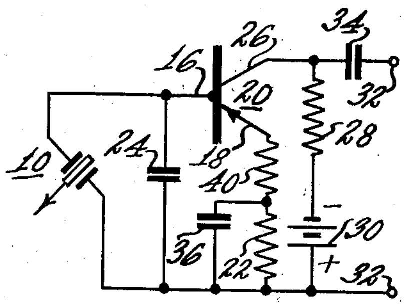
Figure 2 is a schematic circuit diagram of a transistor amplifier circuit, as a further embodiment in accordance with the invention; and, Figure 3 is a schematic circuit diagram of a transistor amplifier circuit of a further embodiment of the invention.

Referring now to Figure 2, a transducer or pickup 10 is connected, as in Figure 1, between the base electrode 16 and the emitter electrode 18 through an emitter resistor 22. The input capacitor 24 is connected across the transducer 10, and the collector electrode is connected through the load resistor 28 to the battery 30. Signals are conveyed from the collector 26 through a coupling capacitor 34 to one of a pair of output terminals 32, the other of which is connected to the emitter electrode 18 through the emitter resistor 22. An additional resistor 40 has been provided in the emitter electrode circuit to provide properly equalized characteristics in the high audio frequencies for record reproduction.

In order to provide less degeneration at high audio frequency signals, a bypass capacitor 36 is connected across the emitter resistor 22. Thus, at the higher frequencies the impedance in the emitter circuit will become less since the bypass capacitor 36 will decrease in impedance as the frequency increases. The minimum emitter impedance and thus the maximum increase in the high audio frequencies is set by the value of the resistor 40. Such action will produce a boost or accentuation of high audio or treble frequency signals. In all other respects the circuit of Figure 2 operates in a manner identical to that of Figure 1. The base bias supply circuit means is omitted here likewise to simplify the description and consideration of the fundamentals of the system.

Figure 3:
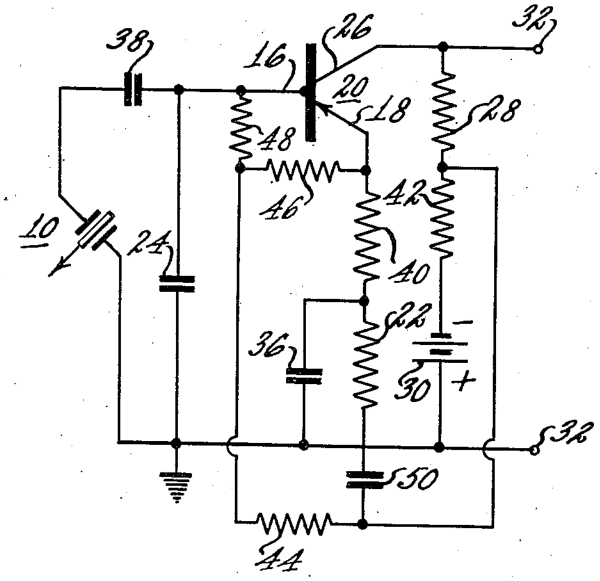

Referring now to Figure 3, a transistor amplifier circuit for a crystal phonograph pickup as constructed and tested includes components additional to those shown in Figures 1 and 2 to provide proper operating biases for the electrodes of the transistor 20. The transducer 10 is connected through a coupling capacitor 38 between the base electrode 16 and a source of reference potential or ground. The capacitor 38 prevents the bias voltage on the base electrode 16 from appearing across the transducer 10. The parallel or shunt input capacitor 24 is connected between the base electrode 16 and ground, and the emitter electrode 18 is connected to ground through a pair of series connected emitter resistors 40 and 22. A treble boost capacitor 36 is connected between the junction of the emitter resistors 40 and 22 and ground, that is, across the resistor 22, to provide a boost or accentuation of the high audio frequencies in the manner previously described. The collector electrode 26 is connected to ground through the load resistor 28 and a voltage divider resistor 42 serially connected with the battery 30. The output terminals 32 are connected to the collector electrode 26 and ground.

Operating bias for the base and emitter electrodes 16 and 18 is provided by connecting the junction of the load resistor 28 and a voltage divider resistor 42 through a first voltage dropping resistor 44 and a second voltage dropping resistor 46 to the emitter electrode 18. The base electrode 16 is connected to the junction of the resistors 44 and 46 through a supply resistor 48. A signal bypass capacitor 50 is connected between ground and the junction of the load resistor 28 and the voltage divider resistor 42.

It will be seen that the circuit of Figure 3 is similar to that of Figures 1 and 2, with the exception that specific bias arrangements have been provided for the base and emitter electrodes 16 and 18. The operation of the circuit, however, is essentially the same as that described with reference to Figures 1 and 2. Signals generated by the transducer 10 and amplified through the transistor 20 and appear at the output terminals 32 from which terminals they may be connected to any further amplifier circuits that may be desired.

By way of example, the following values for the various elements of the circuit of Figure 3 have been found to give satisfactory results for the amplification of signals from a crystal phonograph pickup 10 of 1,000 micro-micro-farads capacitance:

| | | |
|---|---|---|
| Transistor **20** | Type | 2N109 |
| Capacitor **38** | micro-farads | .1 |
| Capacitor **24** | do | .04 |
| Capacitor **36** | do | .25 |
| Capacitor **50** | do | 10 |
| Resistor **48** | ohms | 20,000 |
| Resistor **46** | do | 1,000 |
| Resistor **44** | do | 47,000 |
| Resistor **40** | do | 180 |
| Resistor **22** | do | 820 |
| Resistor **28** | do | 10,000 |
| Resistor **42** | do | 5,000 |
| Battery **30** | volts | 22 |

The circuit as constructed using the above mentioned values gave approximately 10 db improvement in signal-to-noise ratio over a conventional circuit with resistor compensation in the base lead when both circuits had the same gain and frequency response. It will be noted that the emitter resistors 40 and 22 will again provide attenuation by negative feedback of the signal and that this feedback is reduced at the high audio frequencies by the capacitor 36 that is connected in parallel with the emitter resistor 22. The reduction in feedback at the high audio frequencies is limited, however, by the unbypassed resistor 40 in the emitter circuit.

The bypassed emitter resistor 22 may be used alone if more high audio frequency boost is desired or if the internal resistance in the emitter electrode of the transistor 20 is sufficiently high to be able to perform the function of the external resistor 40. The capacitor 36 will again be effective to provide less degeneration of the high than of the low audio frequency signals to enable proper reproduction of commercial phonograph records.

It has been found in an actual circuit constructed with the second emitter resistor 40 eliminated that the same component values as described with reference to Figure 3 may be used, with the following exceptions: Capacitor 24 has a value of .25 micro-farad; capacitor 36 has a value of 2 micro-farads; resistor 22 has a value of 120 ohms; and resistor 40 is not used. The preformance of the circuit with these changes is substantially identical with the performance of the circuit shown in Figure 3 except for the high frequency boost above mentioned.

As will be seen from the foregoing description, a transistor amplifier circuit for an electro-mechanical transducer or the like, such as a crystal phonograph pickup, constructed in accordance with the invention is characterized by relatively high gain and high signal-to-noise ratio. A few low cost components of reasonably small size are required and thus the invention may find wide application in the field of phonograph apparatus.

What is claimed is:

1. A transistor signal amplifier circuit for an electro-mechanical transducer having an essentially capacitive internal impedance, comprising a transistor having base, emitter, and collector electrodes, input circuit means for applying the output signal current of said transducer to said base and emitter electrodes, means for deriving an output signal from said collector electrode, means including a resistive impedance element connected with said emitter electrode providing an impedance in said input circuit means, and capacitive impedance means connected in parallel with said input circuit means to provide with said impedance element and the internal capacitance of said transducer a load circuit for said transducer having a time constant of a high value to compensate for frequency response variation of the output current of said transducer.

2. The combination with an electro-mechanical transducer having an essentially capacitive internal impedance, of a transistor signal amplifier circuit for amplifying signals from said transducer comprising, a transistor having base, emitter, and collector electrodes, means for applying the output signal current of said transducer between said base and emitter electrodes, means for deriving an output signal from said collector electrode, means including a resistive impedance element connected with said emitter electrode providing an input circuit impedance for said transistor, and capacitive impedance means connected in parallel with said transducer to provide with the internal capacitive impedance of said transducer and the input impedance of said transistor a time constant of a high value to compensate for the frequency response variations of the output current of said transducer.

3. A transistor signal amplifier circuit for amplifying signals of an electro-mechanical transducer having an essentially capacitive internal impedance, comprising a transistor having base, emitter, and collector electrodes, signal input circuit means for applying the output signal current of said transducer between said base and emitter electrodes, signal output circuit means connected with said collector electrode, resistive impedance means connected with said emitter electrode providing an essentially resistive input impedance for said transistor, and capacitive impedance means connected in parallel with said input circuit means to provide with the internal capacitance of said transducer and the input impedance of said transistor a circuit time constant of a high value to compensate for the frequency response variations of the output current of said transducer.

4. A transistor signal amplifier circuit for amplifying signals of an electro-mechanical transducer having an essentially capacitive internal impedance, comprising a transistor having base, emitter, and collector electrodes, a signal input circuit connected for applying the output signal current of said transducer to said base and emitter electrodes, signal output circuit means connected with said collector electrode, means including a resistive impedance element connected serially in circuit with said emitter electrode for reflecting an impedance into said input circuit, and capacitive impedance means connected in parallel with said signal input circuit to provide with said impedance and the internal capacitance of said transducer a circuit time constant having a high value to maintain a substantially constant input current from said transducer to said transistor with respect to signal frequency.

5. A transistor signal amplifier for a crystal phonograph pickup device having an essentially capacitive internal impedance, comprising a transistor having base, emitter, and collector electrodes, an input circuit for said transistor connected between said base electrode and a point of fixed reference potential, means for applying the output signal current of said transducer to said input circuit, output circuit means connected with said collector electrode, a resistive impedance element connected between said emitter electrode and said point of fixed reference potential, and a capacitor connected between said base electrode and said point of fixed reference potential, said resistive impedance element, the internal capacitance of said transducer, and said capacitor having values to provide a circuit time constant having a high value to maintain the input current to said transistor constant with respect to the signal frequency despite frequency induced variations in the output current of said transducer.

6. A transistor signal amplifier for amplifying audio frequency signals of a phonograph transducer having an essentially capacitive internal impedance, comprising a transistor having base, emitter and collector electrodes, a signal input circuit for said amplifier connected between said base electrode and a point of fixed reference potential, an output circuit connected between said collector electrode and said point of fixed reference potential, means for applying the output signal current of said transducer to said signal input circuit, a first and a second serially connected resistor elements connected between said emitter electrode and said point of fixed reference potential, a capacitor connected in parallel with one of said first and second resistor elements to reduce signal degeneration of the high audio frequencies by said resistor elements, and an input capacitor connected between said base electrode and said point of fixed reference potential, said resistor elements, the internal capacitance of said transducer and said input capacitor having values to provide a time constant having a high value to maintain the input current to said transistor constant with respect to the signal frequency despite frequency dependent changes in the output current of said transducer.

No references cited.